United States Patent
Huang et al.

(10) Patent No.: US 7,592,262 B2
(45) Date of Patent: Sep. 22, 2009

(54) METHOD FOR MANUFACTURING MOS TRANSISTORS UTILIZING A HYBRID HARD MASK

(75) Inventors: Hui-Ling Huang, Tai-Chung (TW); Ming-Shing Chen, Kaohsiung County (TW); Nien-Chung Li, Hsin-Chu (TW); Li-Shiun Chen, Hsinchu (TW); Hsin Tai, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 283 days.

(21) Appl. No.: 11/689,508

(22) Filed: Mar. 21, 2007

(65) Prior Publication Data
US 2008/0233746 A1 Sep. 25, 2008

(51) Int. Cl.
*H01L 21/302* (2006.01)
(52) U.S. Cl. .................. 438/717; 438/719; 438/724; 438/725; 438/743; 438/744
(58) Field of Classification Search .......... 438/717, 438/719, 724, 725, 743, 744
See application file for complete search history.

(56) References Cited

U.S. PATENT DOCUMENTS

| | | | |
|---|---|---|---|
| 5,132,756 A * | 7/1992 | Matsuda | 257/653 |
| 6,521,963 B1 * | 2/2003 | Ota et al. | 257/412 |
| 6,911,397 B2 | 6/2005 | Jun et al. | |
| 2006/0043430 A1 * | 3/2006 | Feudel et al. | 257/213 |
| 2006/0194399 A1 * | 8/2006 | Wen et al. | 438/305 |
| 2007/0020777 A1 * | 1/2007 | Tso et al. | 438/14 |
| 2007/0045750 A1 * | 3/2007 | Liao et al. | 257/377 |
| 2008/0079033 A1 * | 4/2008 | Waite et al. | 257/255 |

FOREIGN PATENT DOCUMENTS

CN 1459844 12/2003

* cited by examiner

*Primary Examiner*—Binh X Tran
(74) *Attorney, Agent, or Firm*—Winston Hsu

(57) ABSTRACT

A method for manufacturing MOS transistor with hybrid hard mask includes providing a substrate having a dielectric layer and a polysilicon layer thereon, forming a hybrid hard mask having a middle hard mask and a spacer hard mask covering sidewalls of the middle hard mask on the polysilicon layer, performing a first etching process to etch the polysilicon layer and the dielectric layer through the hybrid hard mask to form a gate structure, performing a second etching process to form recesses in the substrate at two sides of the gate structure, and performing a SEG process to form epitaxial silicon layers in each recess.

29 Claims, 16 Drawing Sheets

METHOD FOR MANUFACTURING MOS TRANSISTORS UTILIZING A HYBRID HARD MASK

BACKGROUND OF THE INVENTION

1. Field of the Invention

The present invention relates to methods for manufacturing metal-oxide semiconductor (MOS) transistors utilizing a hybrid hard mask, and more particularly, to methods for manufacturing MOS transistors with a selective epitaxial growth (SEG) method.

2. Description of the Prior Art

Selective epitaxial growth (SEG) technology is used to form an epitaxial silicon layer on a single-crystalline substrate, in which the crystalline orientation of the epitaxial silicon layer is almost identical to that of the substrate. SEG technology is widely applied in manufacturing numerous kinds of semiconductor devices, such as MOS transistors having raised source/drain regions which benefits from good short channel character and low parasitical resistance and a MOS transistor having recessed source/drain which improves drain induced barrier lowering (DIBL) and punchthrough effect and reduces off-state current leakage and power consumption.

Generally, SEG technology includes performing a cleaning process to remove native oxides and other impurities from a surface of a substrate, then depositing an epitaxial silicon layer on the substrate and making the epitaxial silicon layer grow along with the silicon lattice of the substrate. Please refer to FIGS. 1-4, which are schematic drawings illustrating a conventional method for manufacturing a MOS transistor with SEG technology. As shown in FIG. 1, a substrate 100 such as a silicon substrate having a plurality of shallow trench isolations (STI) 102 formed thereon on is provided. A dielectric layer 112, a polysilicon layer 114, and a hard mask layer comprising silicon nitride or silicon oxide are sequentially formed on the substrate 100. The hard mask layer is patterned by a lithography process and the patterned hard mask layer 120 is used to define a position and a length of a gate.

Please refer to FIG. 2. Then, an etching process is performed to remove portions of the polysilicon layer 114 and the dielectric layer 112, thus a gate 110 is formed. Next, an ion implantation process is performed to form lightly doped drains (LDDs) 116 in the substrate 100 respectively at two sides of the gate 110, and a spacer 118 is formed on sidewalls of the gate 110. Please refer to FIGS. 3-4. The patterned hard mask layer 120 and the spacer are used to be an etching mask in an etching process to form recesses 130 in the substrate 100 at the two sides of the gate 110. As shown in FIG. 4, then an epitaxial silicon layer 132 is formed along surface of the substrate 100 in the recesses 130 by a SEG process. In addition, an ion implantation process is performed before etching the recesses 130 or after forming the epitaxial silicon layer 132 to complete formation of the recessed source/drain.

It is noteworthy that the substrate 100 will undergo many etching or cleaning processes after forming the gate 100 and before performing the SEG process, for example, a cleaning process after etching the polysilicon layer 114, a cleaning process after forming the LDDs 116, the spacer 118 etching and cleaning processes, the recesses 130 etching and cleaning processes, and cleaning process before the SEG process. Those cleaning or etching processes repeatedly consume the patterned hard mask layer 120 covering the polysilicon layer 114. Such exposure is usually and easily happened on corners of the patterned hard mask 120. Therefore the polysilicon layer 114 may be exposed before performing the SEG process due to the consumption of the patterned hard mask layer 120. It is known that the epitaxial silicon layer 132 grows on all exposed silicon surfaces, and the epitaxial silicon layer 132 grown on the source and drain regions are desirable while the epitaxial silicon layer 132 grown on the gate 110 is undesirable because the growth causes dopants in the gate 110 to diffuse into the newly grown epitaxial silicon, and thus results in a decrease in gate activation or an increase in the gate inversion, which leads to degradation of the device performance. Furthermore, the undesirably grown epitaxial silicon layer 132 on the gate 110 makes it possible to form a link of conductive silicon from the gate 110 over the spacer 118 to the source/drain in the following processes and causes short circuit.

In addition, the patterned hard mask layer 120 comprising silicon nitride is uneasy to be removed. Removal of the patterned hard mask layer 120, exemplary removal of the patterned hard mask layer 120 for forming a salicide on the surface of the polysilicon layer 114, usually damages profile of the gate 110. More undesirably, the spacer 118 may be removed together with the patterned hard mask layer 120 and thus the damage extends to the sidewalls of the gate 110 or the dielectric layer 112 underneath the polysilicon layer 114.

Therefore a hard mask layer effectively resisting consumption during the cleaning and etching processes and that is easily removed without damaging other elements is in need of an immediate solution.

SUMMARY OF THE INVENTION

Therefore the present invention provides methods for manufacturing MOS transistors utilizing a hybrid hard mask to prevent damages resulted from consumption and removal of the hard mask layer.

According to the claimed invention, a method for manufacturing MOS transistors utilizing a hybrid hard mask is provided. The method comprises providing a substrate having at a dielectric layer and a polysilicon layer, forming at least a hybrid hard mask having a middle hard mask and a spacer hard mask covering sidewalls of the middle hard mask on the polysilicon layer, performing a first etching process to etch the polysilicon layer and the dielectric layer with the hybrid hard mask being an etching mask to form a gate structure, performing a second etching process to form recesses in the substrate respectively at two sides of the gate structure, and performing a selective epitaxial growth (SEG) process to form epitaxial silicon layer in each recess.

According to the claimed invention, another method for manufacturing MOS transistors utilizing a hybrid hard mask is provided. The method comprises providing a substrate having a dielectric layer and a polysilicon layer, sequentially forming a first hard mask layer and a second hard mask layer on the polysilicon layer, performing a lithography and etching process to remove portions of the first hard mask layer and the second hard mask layer and form a middle hard mask, forming a third hard mask layer covering the polysilicon layer and the middle hard mask, performing an etching back process to remove portions of the third hard mask layer to form at least a spacer hard mask covering sidewalls of the middle hard mask and form a hybrid hard mask, performing a first etching process to etch the polysilicon layer and the dielectric layer with the hybrid hard mask being an etching mask to form a gate structure, performing a second etching process to form recesses in the substrate respectively at two sides of the gate structure, and performing a SEG process to form epitaxial silicon layer in each recess.

According to the claimed invention, a hybrid hard mask layer for manufacturing MOS transistors is further provided. The hybrid hard mask comprises a middle hard mask and a spacer hard mask positioned on sidewalls of the middle hard mask.

According to the claimed invention, a MOS transistor is further provided. The MOS transistor comprises a gate structure positioned on a substrate, a hybrid hard mask layer comprising a middle hard mask and a spacer hard mask layer forming on the gate structure, lightly doped drains positioned in the substrate respectively on two sides of the gate structure, and epitaxial silicon layers positioned in the substrate respectively on the tow sides of the gate structure for be a source/drain.

According to the method of manufacturing MOS transistors utilizing a hybrid hard mask provided by the present invention, the spacer hard mask of the hybrid hard mask effectively resists consumption in each etching and cleaning process while the middle hard mask, which is the principle part of the hybrid hard mask, makes the hybrid hard mask able to be removed easily, therefore the device covered by the hybrid hard mask is well protected.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
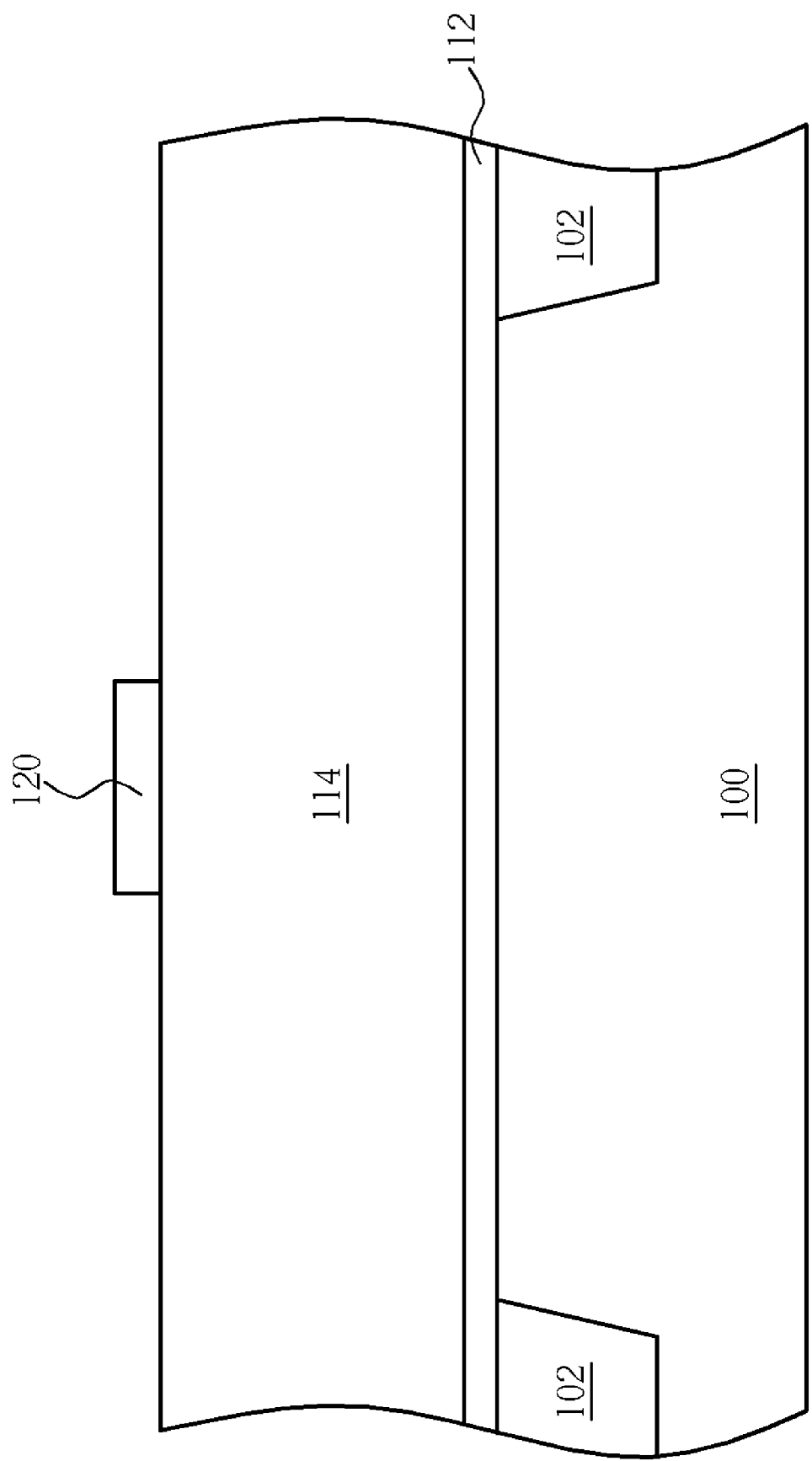
FIGS. 1-4 are schematic drawings illustrating a conventional method for manufacturing a MOS transistor utilizing SEG technology.
Figure 2:
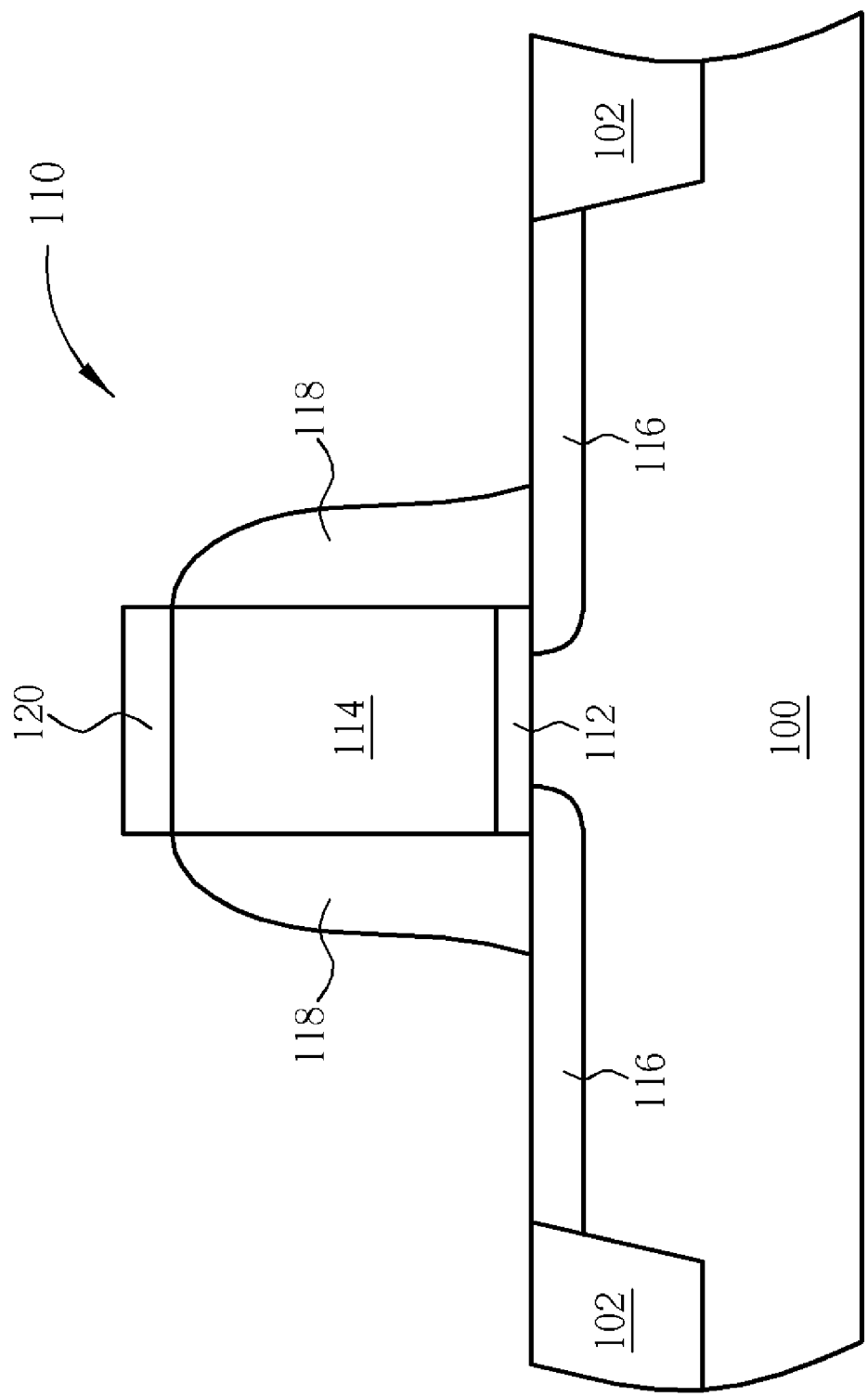
Figure 3:
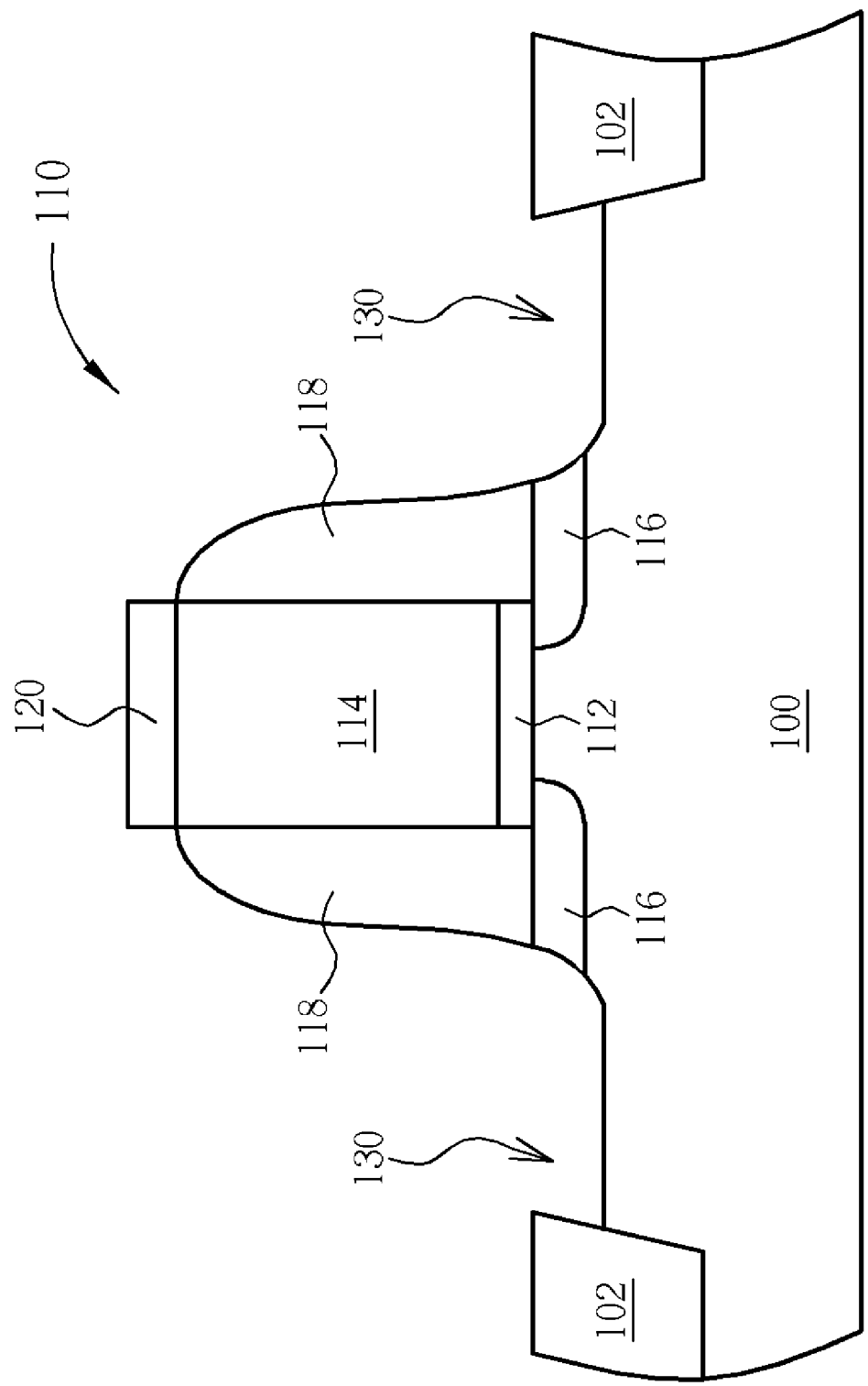
Figure 4:
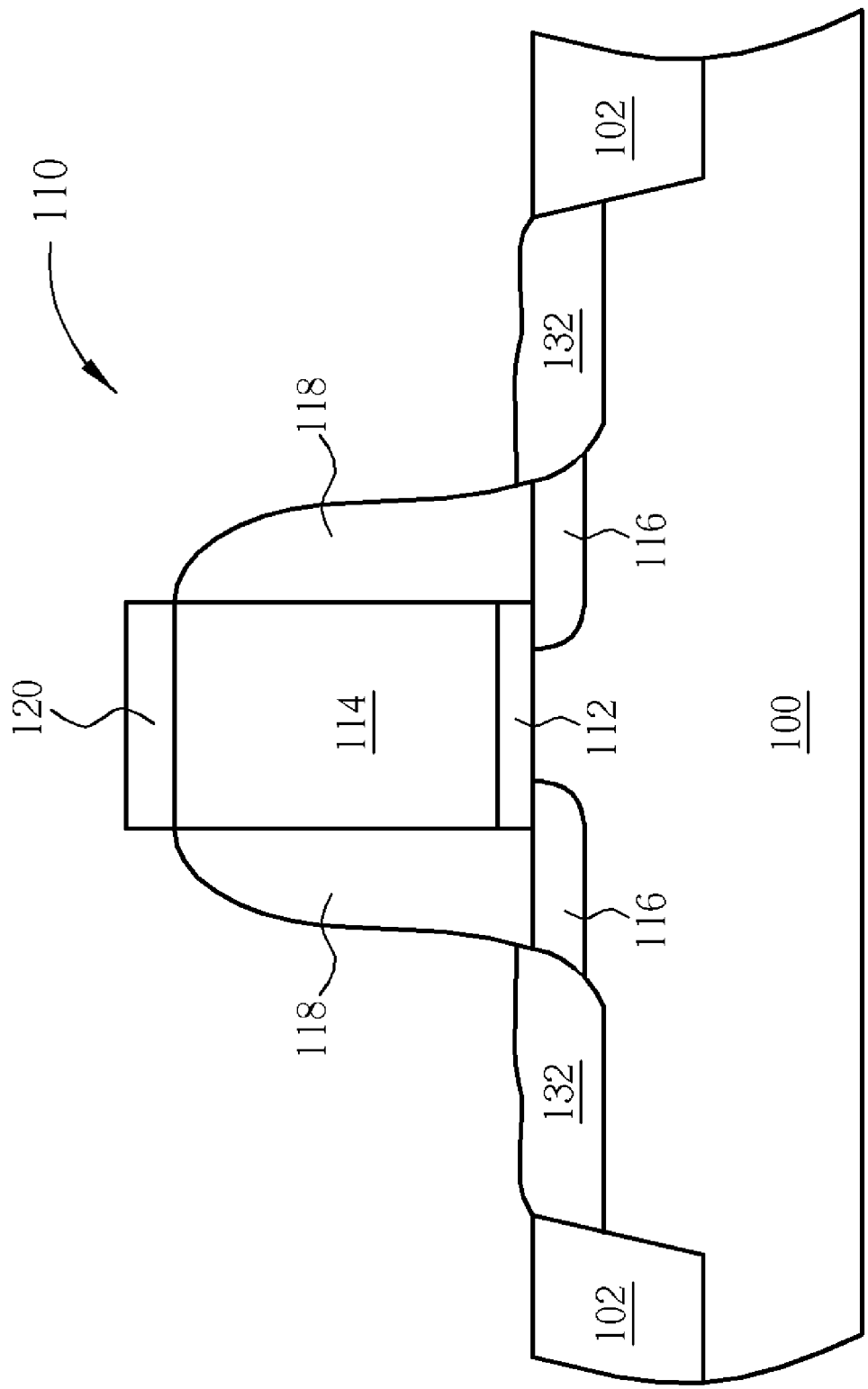
Figure 5:
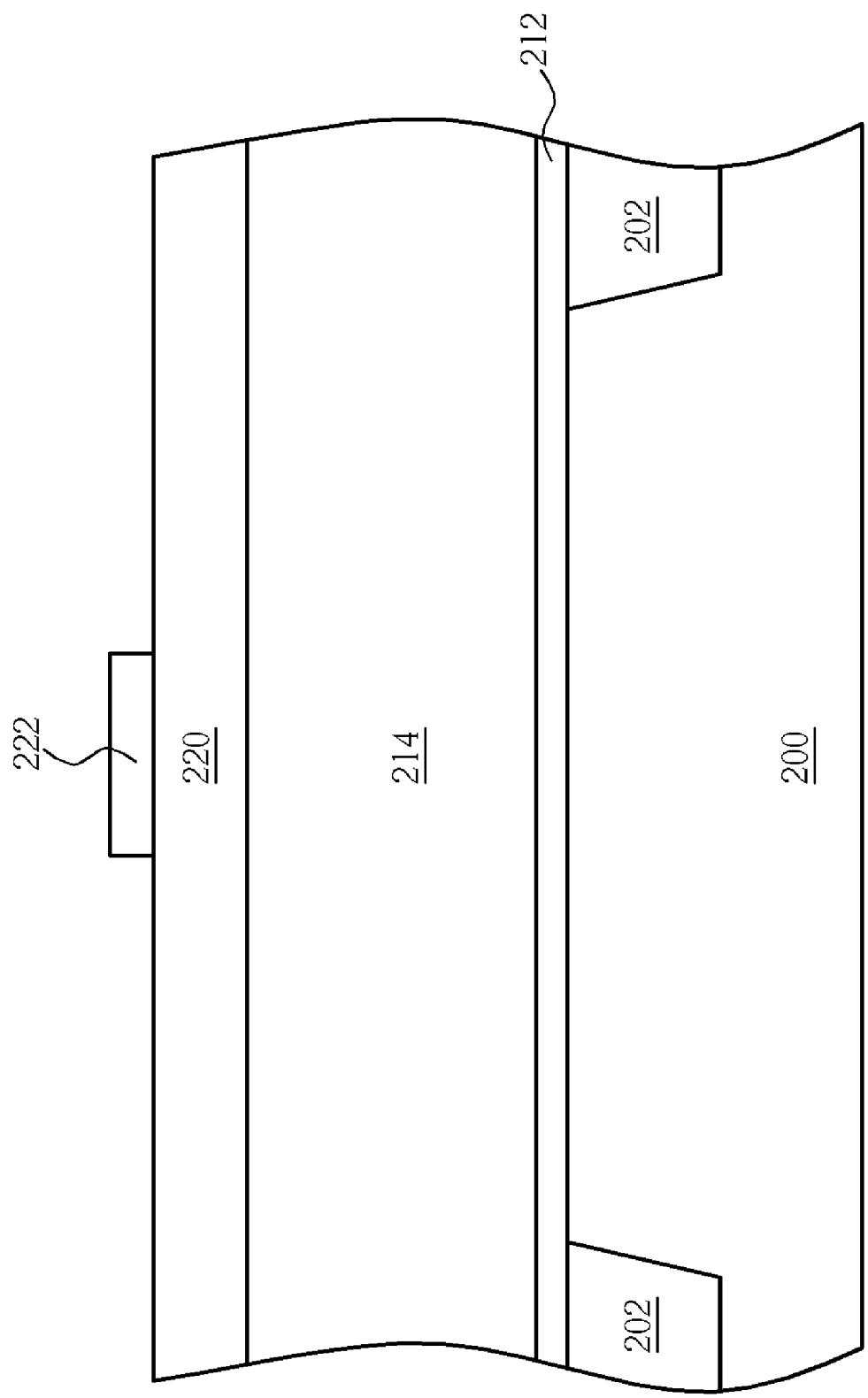
FIGS. 5-11 are schematic drawings illustrating a first preferred embodiment provided by the present invention.

Please refer to FIGS. 5-11, which are schematic drawings illustrating a first preferred embodiment provided by the present invention. As shown in FIG. 5, a substrate 200, such as a silicon substrate, having a plurality of shallow trench isolation (STI) 202 formed thereon is provided. A dielectric layer 212, a polysilicon layer 214, and a first hard mask layer 220 are sequentially formed on the substrate 200. The first hard mask layer 220 comprises silicon oxide, (SiO), silicon nitride (SiN), silicon oxynitride (SiON), silicon carbon nitride (SiCN), silicon carbide (SiC), silicon oxycarbide (SiOC), silicon-rich-nitride (SRN), high temperature oxide (HTO), bottom anti-reflecting coating (BARC) layer, or Bis(tert-butylamino)silane (BTBAS). Then, a photoresist 222 is formed on the first hard mask layer 220 and patterned by a lithography process.

Figure 6:
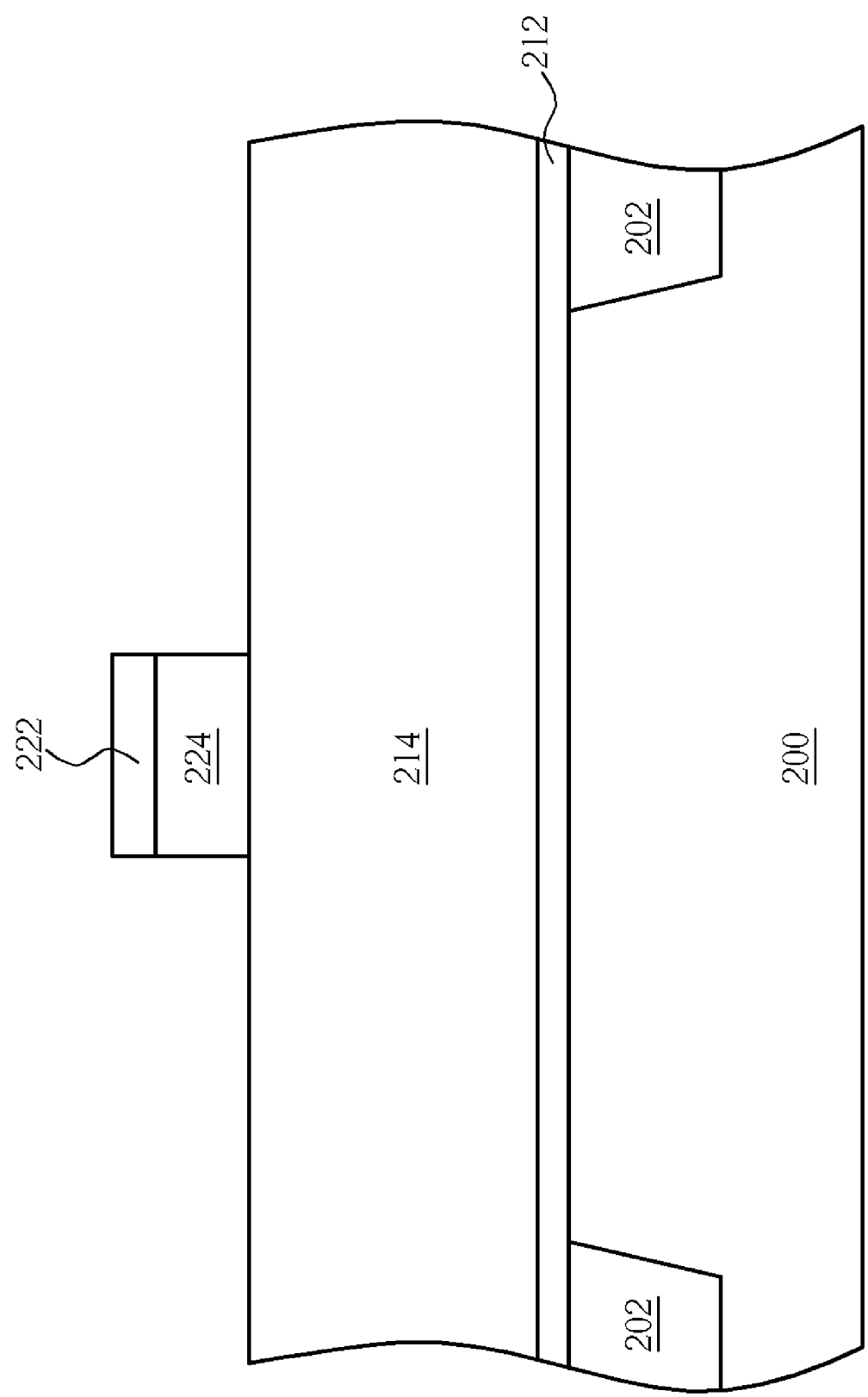

Please refer to FIG. 6. Next, an etching process is performed with the patterned photoresist 222 functioning as a mask to remove portions of the first hard mask layer 220 and form a middle hard mask 224.

Figure 7:
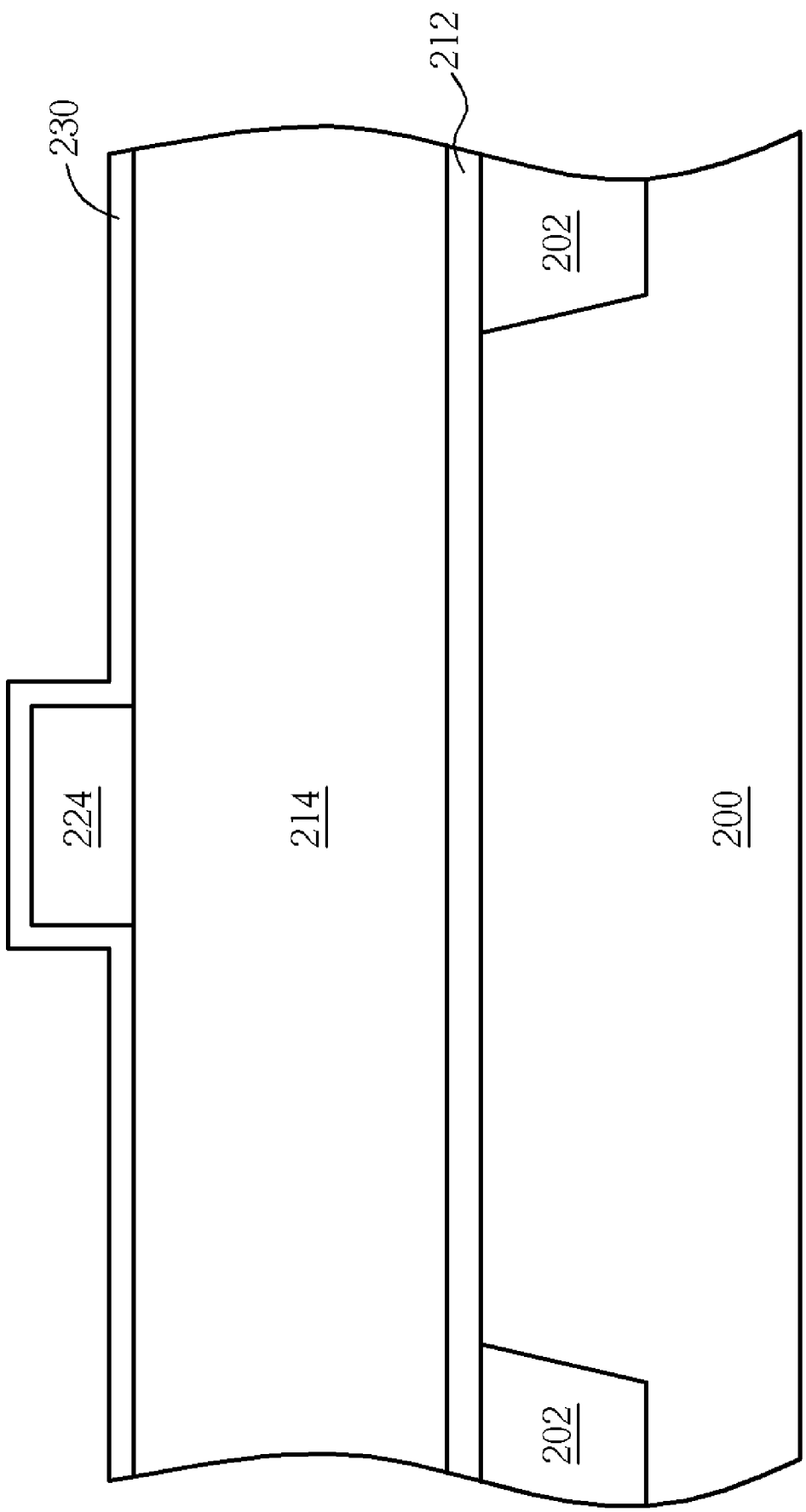

Please refer to FIG. 7. A second hard mask layer 230 is formed on the polysilicon layer 214 and the middle hard mask 224. The second hard mask layer 230 comprises SiN, SiON, SiCN, SiC, SiOC, or silicon-rich-nitride (SRN). Please note that the first hard mask layer 220 and the second hard mask layer 230 have different etching selectivity ratios.

Figure 8:
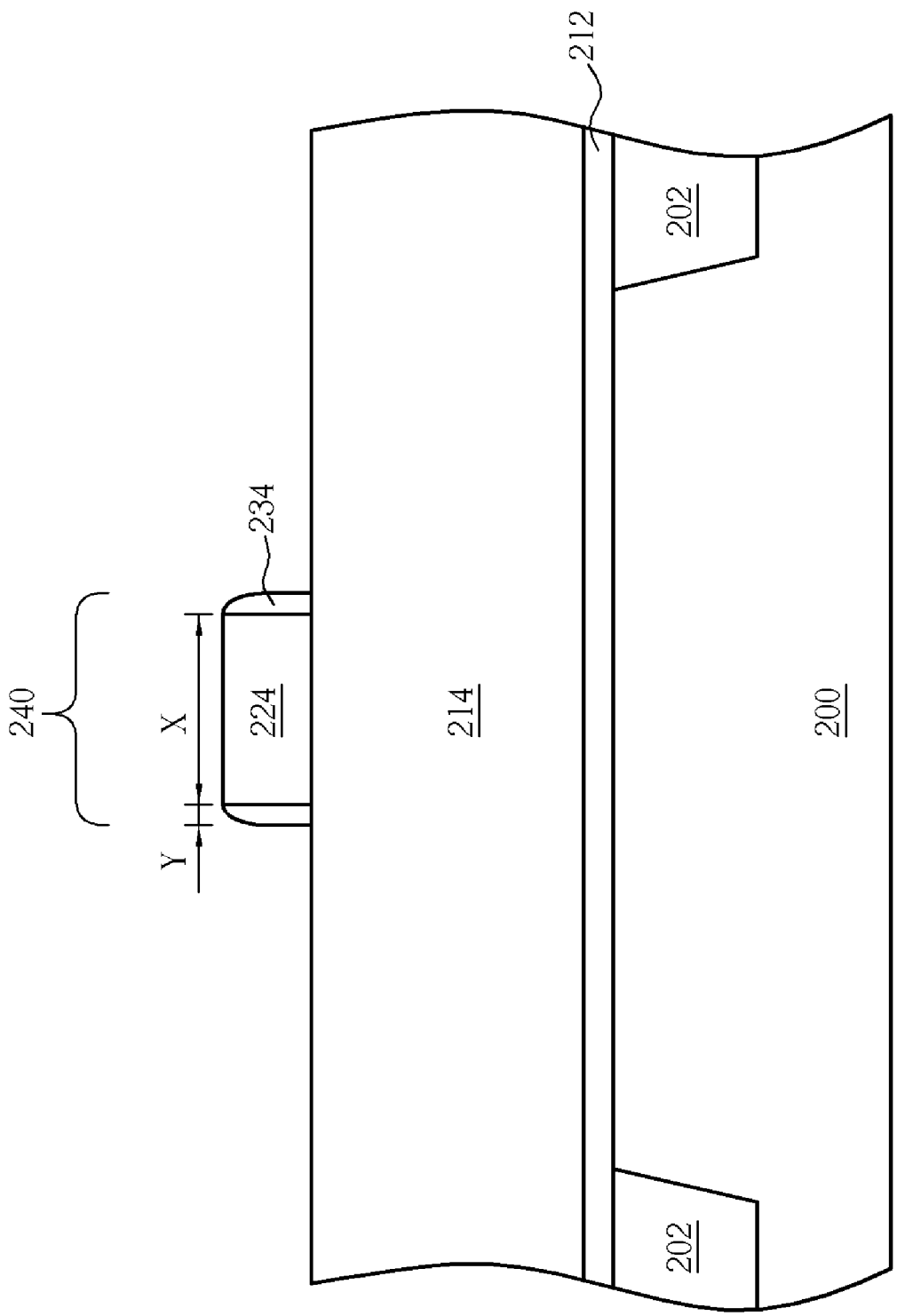

Please refer to FIG. 8. Then, an etching back process is performed to remove portions of the second hard mask layer 230 and form a spacer hard mask 234 covering sidewalls of the middle hard mask 224. The middle hard mask 224 and the spacer hard mask 234 construct a hybrid hard mask 240. As mentioned above, the middle hard mask 224 and the spacer hard mask 234 have different etching selectivity ratios. And, as shown in FIG. 8, a width of the middle hard mask 224 and a width of the spacer hard mask 234 has a ratio of 1:10. In addition, the width of the spacer hard mask 234 is less than 10 nanometers (nm).

The hybrid hard mask 240 provided by the first preferred embodiment of the present invention is used to define a position and a length of a gate structure 210 in a SEG process. Please refer to FIG. 9. A first etching process is performed to etch the polysilicon layer 214 and the dielectric layer 212 through the hybrid hard mask 240 and thus the gate structure 210 is formed. Because the hybrid hard mask 240 is used define the length of the gate structure 210, a trimming process can be performed after the lithography process to trim the patterned photoresist 222. The trimming process also can be performed after the etching process to trim the middle hard mask 234. In summary, the width of the middle hard mask 234 is adjustable in the first preferred embodiment, and the width of the gate structure 210 is defined by the adjustable middle hard mask 234 together with the spacer hard mask 234.

Figure 10:
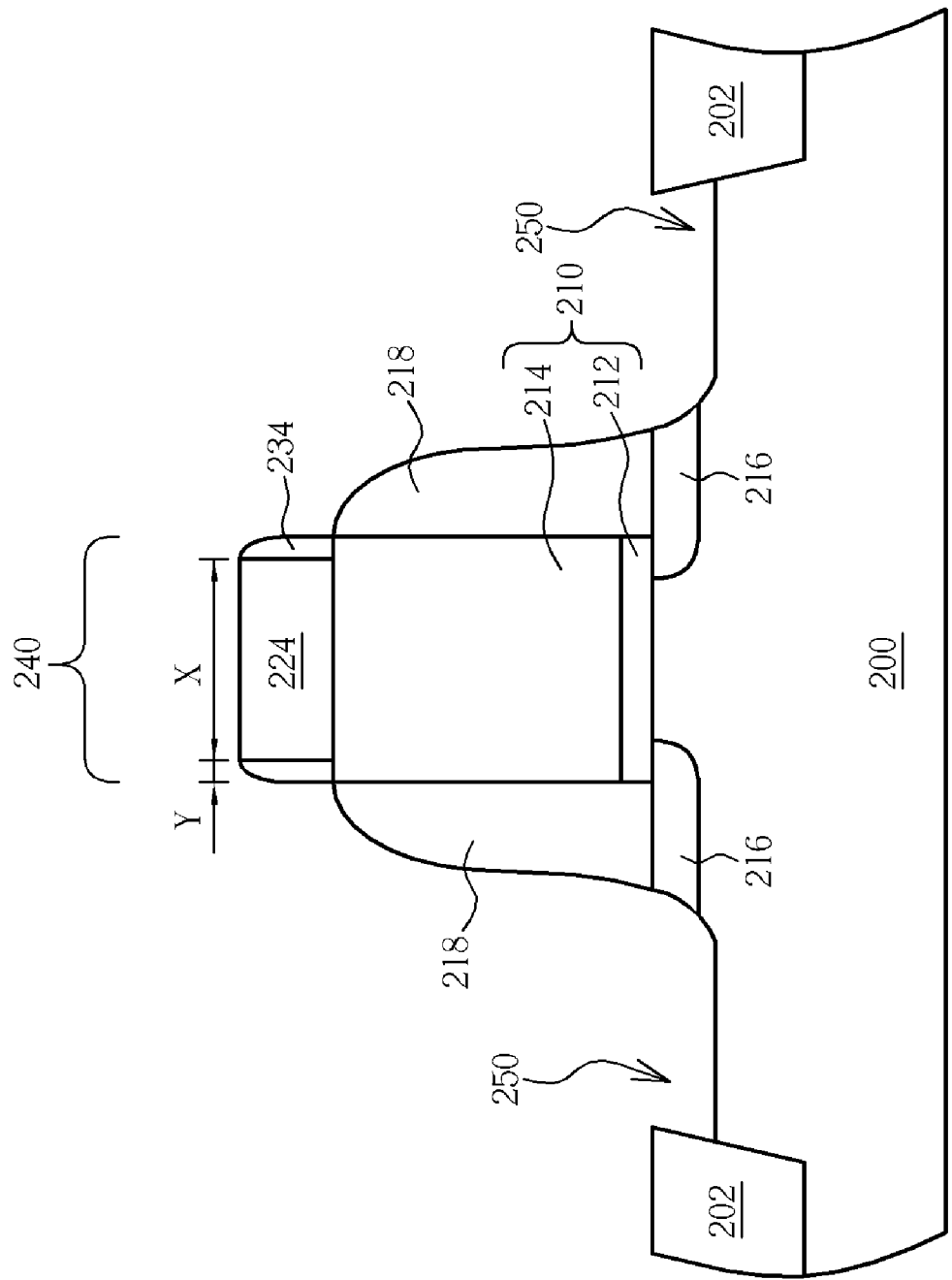

Please refer to FIG. 10. Next, an ion implantation process is performed to form lightly doped drains (LDDs) 216 in the substrate 200 at two sides of the gate structure 210. And a spacer 218 is formed on sidewalls of the gate structure 210. The spacer 218 and the hybrid hard mask 240 are used to be an etching mask in a second etching process which is performed to form recesses 250 in the substrate 200 respectively at the two sides of the gate structure 210.

Figure 11:
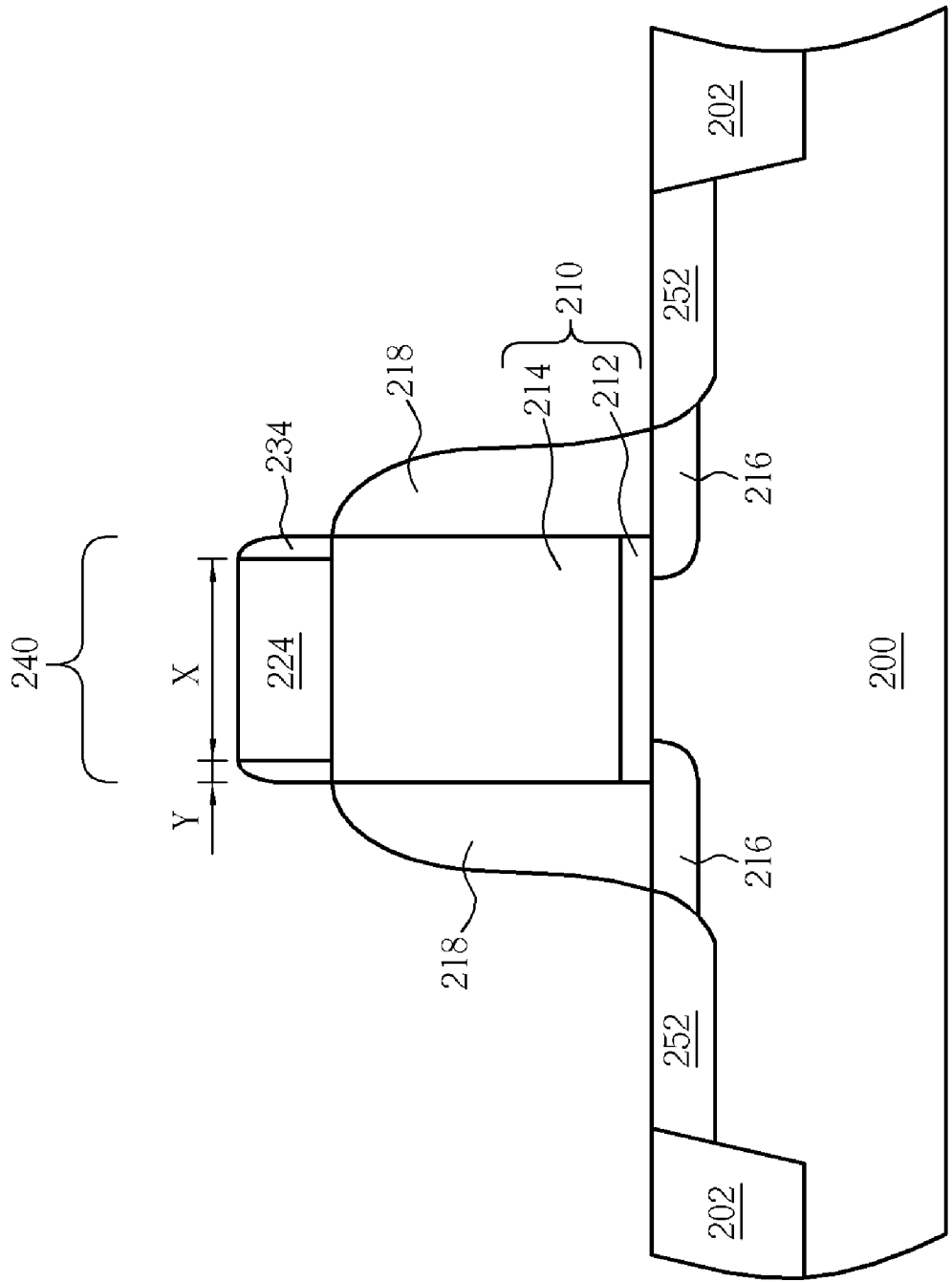

Please refer to FIG. 11. An epitaxial silicon layer 252 is formed along surface of the substrate 200 in each recess 250 by a SEG process to be a recessed source/drain of a MOS transistor. Those skilled in the art will easily realize that an ion implantation process can be performed before etching the recesses 250 or after performing SEG process to complete the formation of the recessed source/drain. When the gate structure 210 is a gate structure of a PMOS transistor, the epitaxial silicon layer 252 comprises silicon germanium (SiGe); when the gate structure 210 is a gate structure of an NMOS transistor, the epitaxial silicon layer 252 comprises silicon carbide (SiC). In addition, the method for manufacturing MOS transistor with a hybrid hard mask is not limited to form the recessed source/drain, it also applies to form a raised source/drain or a planer source/drain.

Before performing the SEG process, the substrate 200 needs to undergo many etching or cleaning processes, such as cleaning process after etching the polysilicon layer 214, cleaning process after forming the LDDs 216, the spacer 218 etching and cleaning processes, the recesses 250 etching and cleaning processes, and cleaning process before the SEG process. Although those cleaning or etching processes repeatedly consume the hybrid hard mask 240, the damages to the hybrid hard mask 240, especially in the corner of the hybrid hard mask 240, is greatly reduced due to the different etching selectivity ratios between the middle hard mask 224 and the spacer hard mask 234. Because the etching selectivity of the spacer hard mask 234 is substantially smaller than that of the middle hard mask 224, damages to the corner of the hybrid hard mask 240 is effectively resisted, thus the gate structure 210 is well protected from the exposure. Consequently the epitaxial silicon layer 252 will not grow on the corner of the gate structure 210 in the SEG process and gate performance is protected from influences such as decrease in gate activation or increase in the gate inversion. And link of conductive silicon from the gate structure 210 over the spacer 218 to the recessed source/drain which causes short circuit in following processes is also avoided.

Meanwhile, since the principle part of the hybrid hard mask 240 is the middle hard mask 224, it makes the hybrid hard mask 240 able to be removed easily and without damaging other elements in following removal process. Therefore profile of the gate structure 210 is protected from damage and the spacer 218 formed on sidewalls of the gate structure 210 is prevented from being removed in the following removal process.

Figure 12:
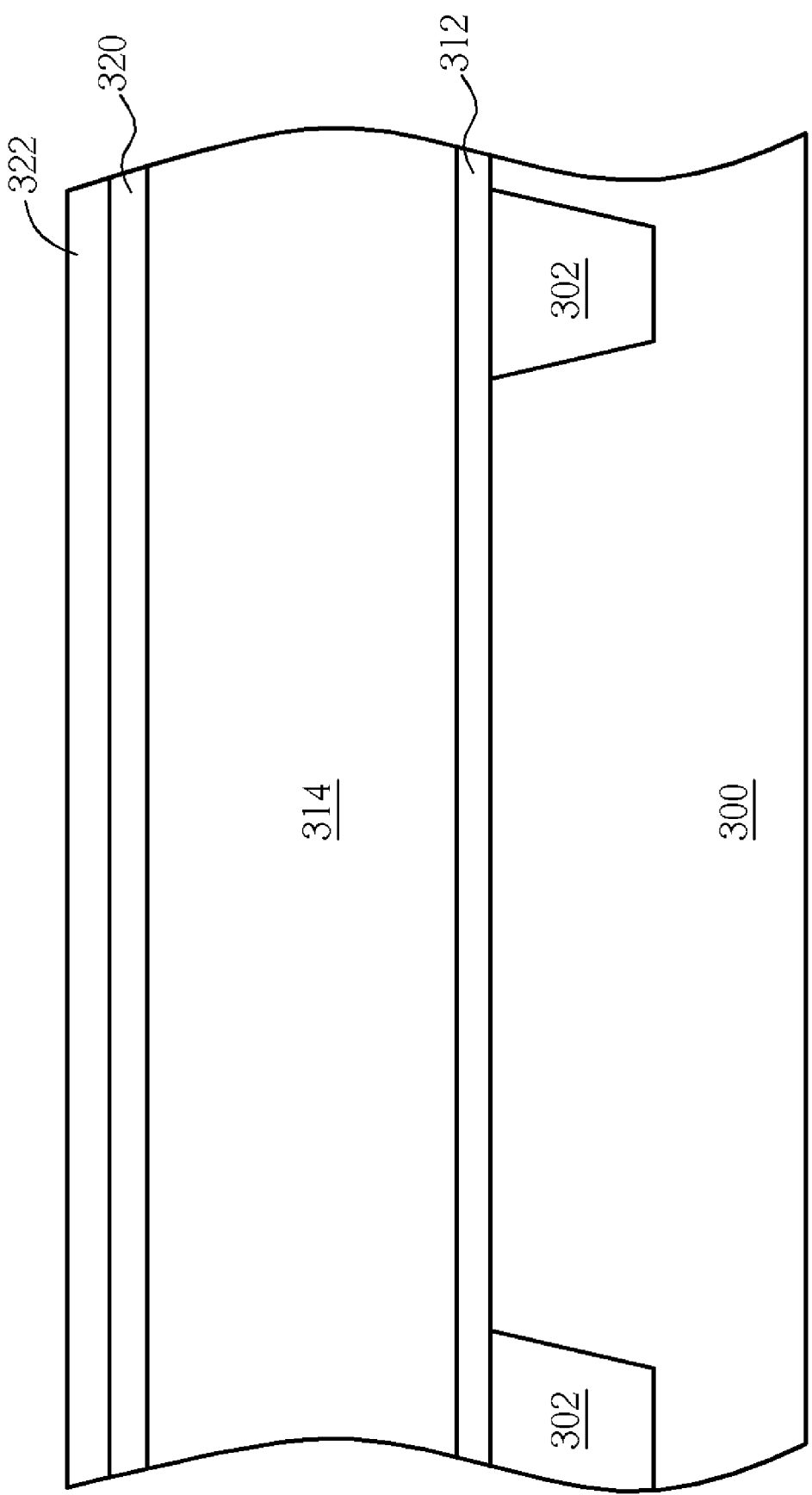
FIGS. 12-16 are schematic drawings illustrating a second preferred embodiment provided by the present invention.

Please refer to FIGS. 12-16, which are schematic drawings illustrating a second preferred embodiment provided by the present invention. As shown in FIG. 12, a substrate 300, such as a silicon substrate, having a plurality of STI 302 formed thereon is provided. Then, a dielectric layer 312, a polysilicon layer 314, a first hard mask layer 320, and a second hard mask layer 322 are sequentially formed on the substrate 300. The first hard mask layer 320 comprises SiO, SiN, SiON, SiCN, SiC, SiOC, silicon-rich-nitride (SRN), high temperature oxide (HTO), bottom anti-reflecting coating (BARC) layer, or Bis(tert-butylamino)silane (BTBAS). The second hard mask layer 322 comprises SiO, SiN, SiON, SiCN, SiC, SiOC, silicon-rich-nitride (SRN), high temperature oxide (HTO), bottom anti-reflecting coating (BARC) layer, or Bis(tert-butylamino)silane (BTBAS). The first hard mask layer 320 and the second hard mask layer 322 have different etching selectivity ratios.

Figure 13:
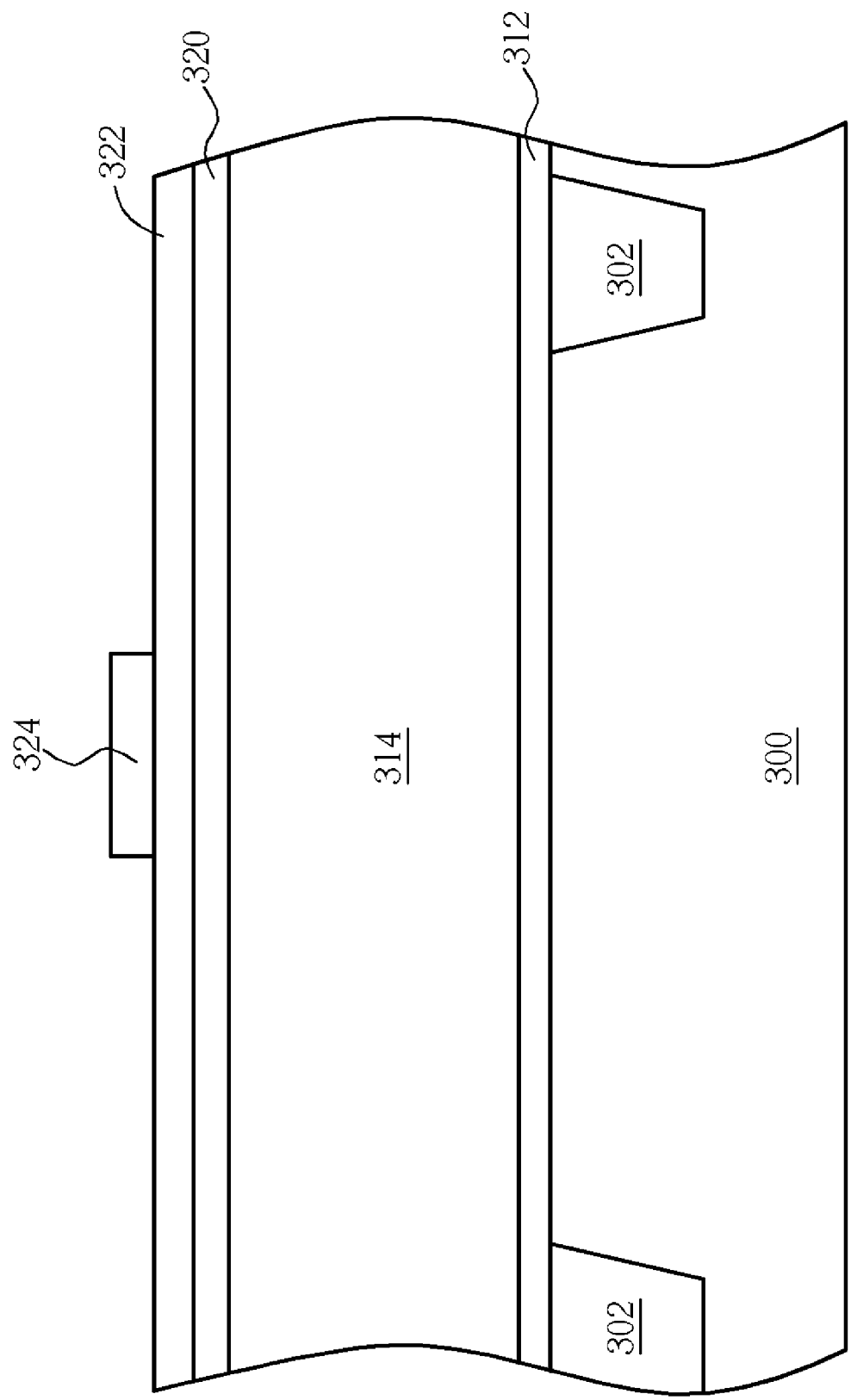
Figure 14:
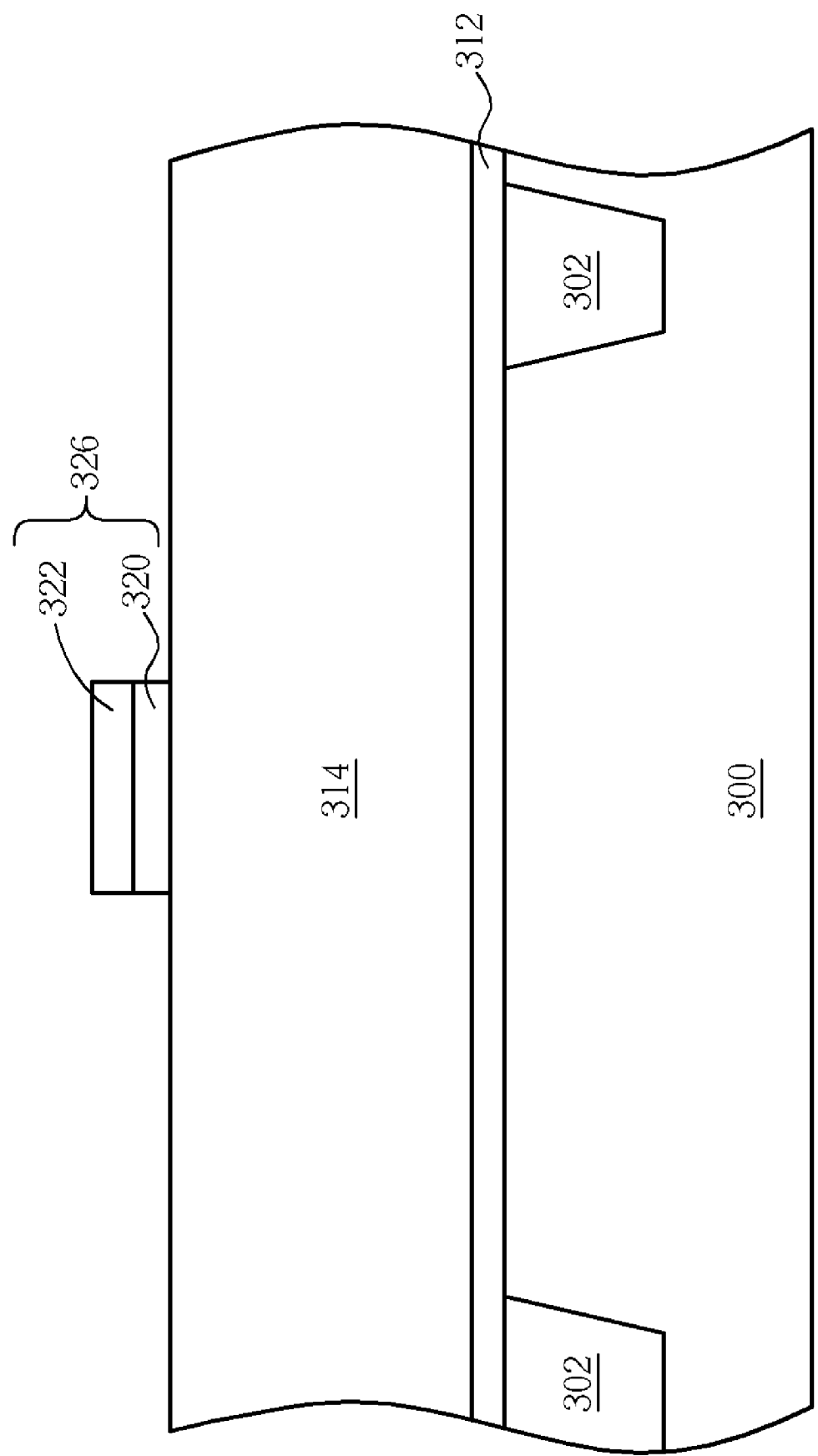

Please refer to FIGS. 13 and 14. Next, a lithography and etching process is performed with a photoresist 324 formed on the second hard mask layer 322 first. Then a lithography process is performed to pattern the photoresist 324 and an etching process is performed through the patterned photoresist 324 to remove portions of the first hard mask layer 320 and the second hard mask layer 322. After the photoresist 324 is removed, a middle hard mask 326 as shown in FIG. 14 is obtained.

Figure 15:
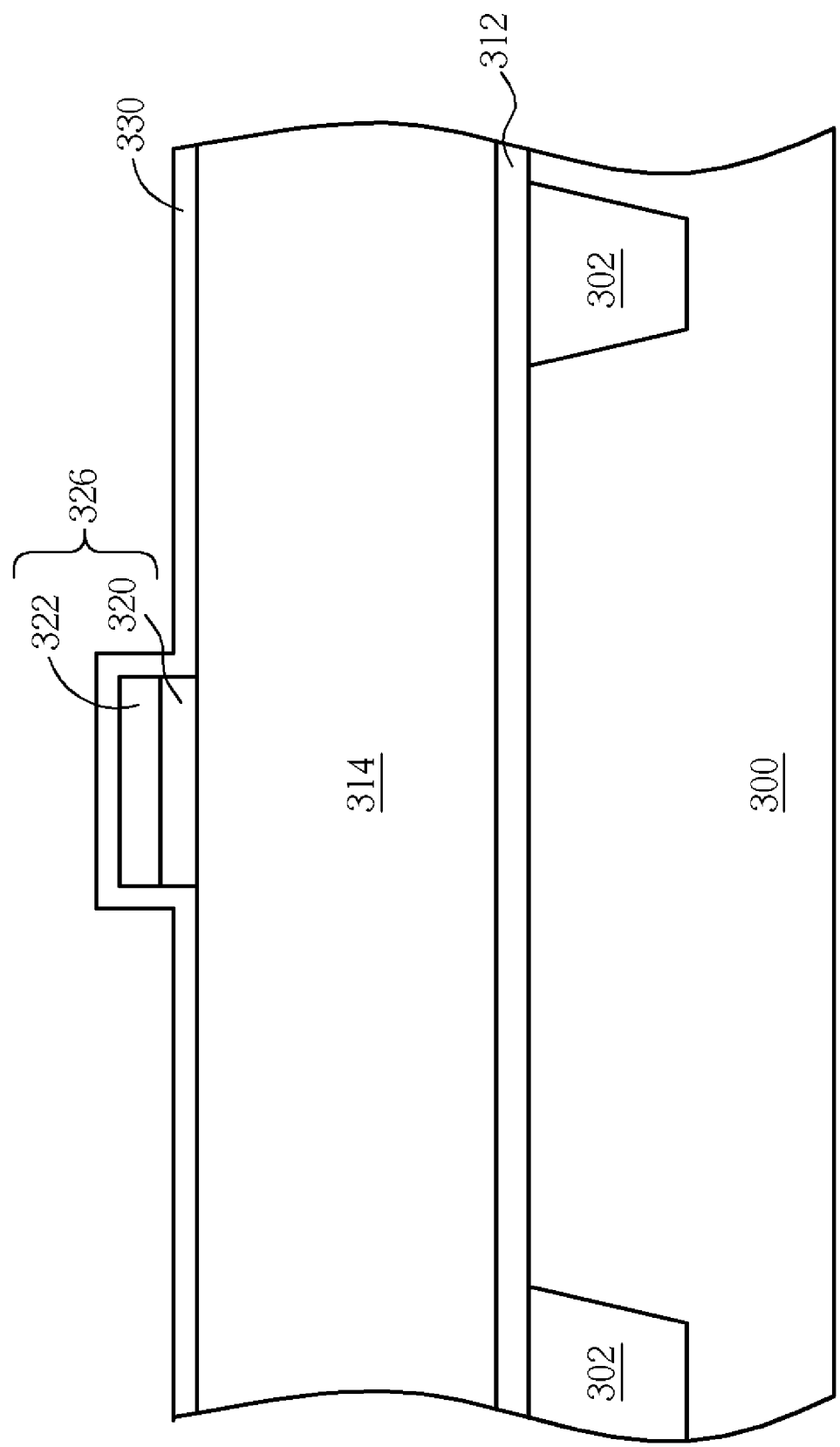

Please refer to FIG. 15. A third hard mask layer 330 is formed on the polysilicon layer 314 and the middle hard mask 326. The third hard mask 330 comprises SiN, SiON, SiCN, SiC, SiOC, or silicon-rich-nitride (SRN).

Figure 16:
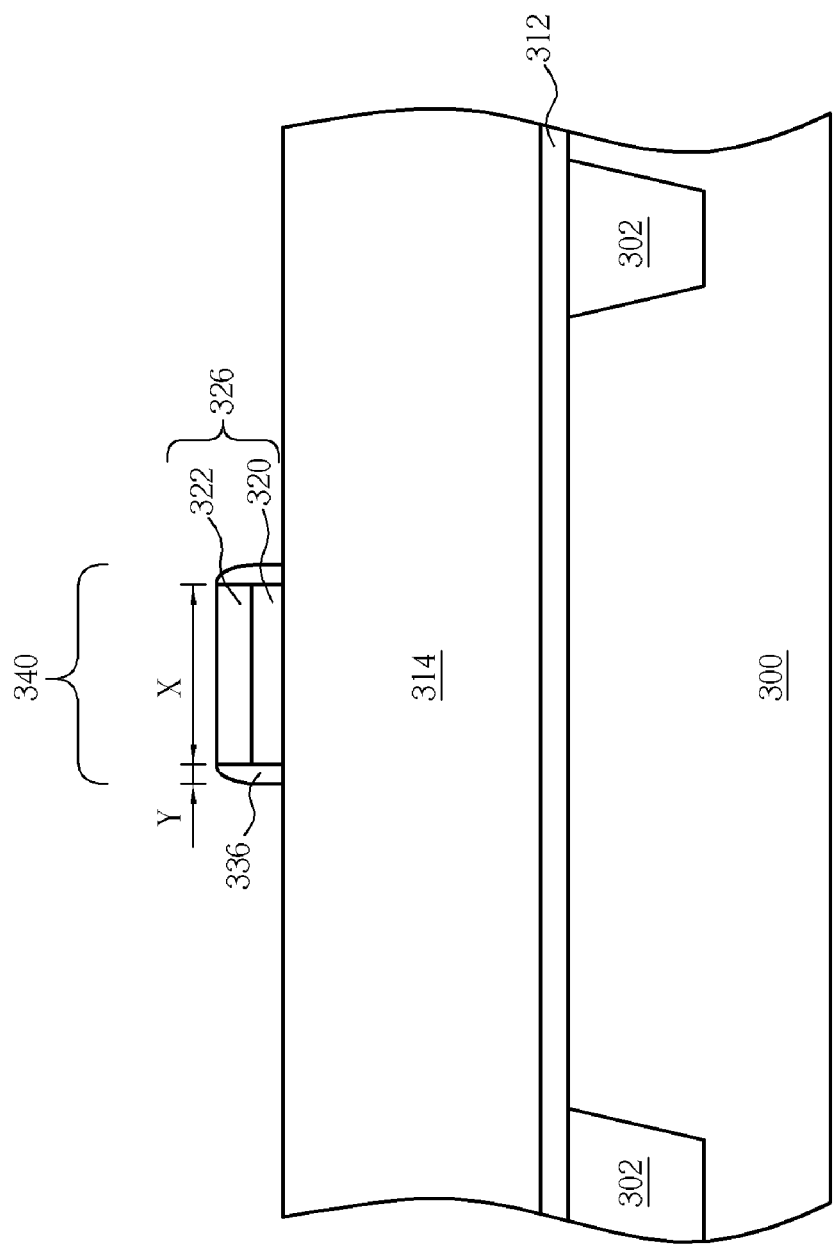

Please refer to FIGS. 15 and 16. Next, an etching back is performed to remove portions of the third hard mask layer 330 and to form a spacer hard mask 336 on sidewalls of the middle hard mask 326. The middle hard mask 326 and the spacer hard mask 336 construct a hybrid hard mask 340. Please note that the middle hard mask 326 and the spacer hard mask 336 have different etching ratios. As shown in FIG. 15, a width of the middle hard mask 326 and a width of the spacer hard mask 336 has a ratio of 1:10. In addition, the width of the spacer hard mask 336 is less than 10 nm.

The hybrid hard mask 340 provided by the second preferred embodiment is used to define a position and a length of a gate structure in a SEG process, as described in the first preferred embodiment. Because the hybrid hard mask 340 is used define the length of the gate structure, a trimming process can be performed after the lithography process to trim the patterned photoresist 324. The trimming process also can be performed after the etching process to trim the middle hard mask 326. In summary, the width of the middle hard mask 326 is adjustable in the second preferred embodiment, and the width of the gate structure is defined by the adjustable middle hard mask 326 together with the spacer hard mask 336. Because the following processes are similar to those in the first preferred embodiment, further description of the processes is omitted in the interest of brevity in the second embodiment.

Since the etching selectivity of the spacer hard mask 336 is substantially smaller than that of the middle hard mask 326, damages to the corner of the hybrid hard mask 340 is effectively resisted, thus the gate structure covered by the hybrid hard mask 340 is well protected from the exposure. Consequently the epitaxial silicon layer will not grow on the corner of the gate structure in the SEG process and gate performance is protected from influences such as decrease in gate activation or increase in the gate inversion. And link of conductive silicon from the gate over the spacer to the recessed source/drain which causes short circuit in the following processes is also avoided.

Meanwhile, since the principle part of the hybrid hard mask 340 is the middle hard mask 326, it makes the hybrid hard mask 340 able to be removed easily and without damaging other elements in following removal process. Therefore profile of the gate structure is protected from damage and the spacer formed on sidewalls of the gate structure is prevented from being removed in the following removal process.

Figure 9:
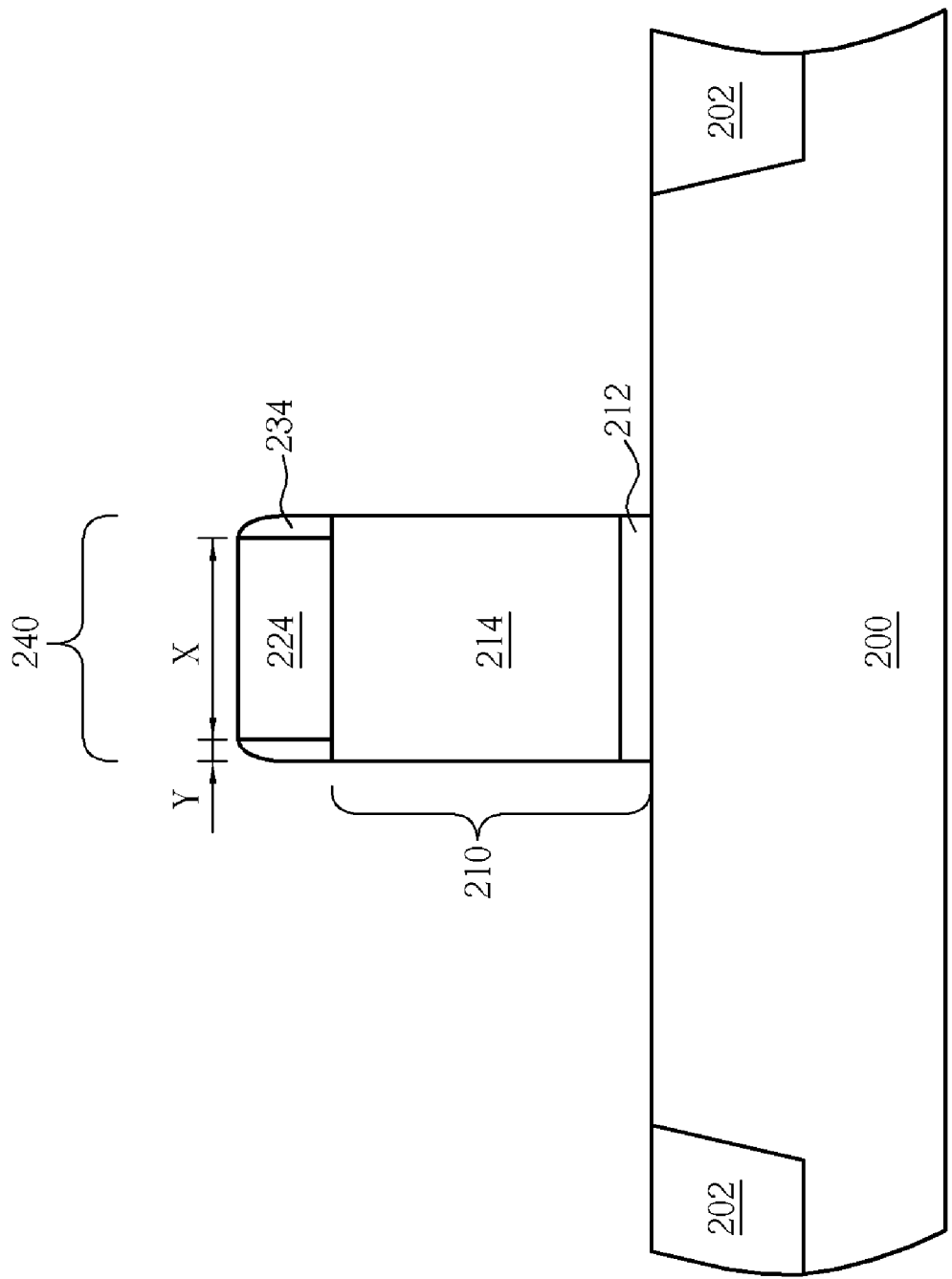

Please refer to FIGS. 9 and 16. As mentioned above, the present invention provides a hybrid hard mask 240/340 comprising a middle hard mask 224/326 and a spacer hard mask 234/336 formed on sidewalls of the middle hard mask 224/326. As shown in FIG. 16, the middle hard mask 224/326 further comprises a bottom hard mask 320 and a top hard mask 322. The bottom hard mask 320 comprises SiO, SiN, SiON, SiCN, SiC, SiOC, silicon-rich-nitride (SRN), high temperature oxide (HTO), bottom anti-reflecting coating (BARC) layer, or Bis(tert-butylamino)silane (BTBAS). The top hard mask 322 comprises SiO, SiN, SiON, SiCN, SiC, SiOC, silicon-rich-nitride (SRN), high temperature oxide (HTO), bottom anti-reflecting coating (BARC) layer, or Bis(tert-butylamino)silane (BTBAS). The bottom hard mask 320 and the top hard mask 322 have similar or different etching selectivity ratios.

The spacer hard mask 234/336 comprises SiN, SiON, SiCN, SiC, SiOC, or silicon-rich-nitride (SRN). The spacer hard mask 234/336 and the middle hard mask 224/326 have different etching selectivity ratios. A width of the middle hard mask 224/326 and a width of the spacer hard mask 234/336 has a ratio of 1:10. In addition, the width of the spacer hard mask 234/336 is less than 10 nm.

Though a substrate bearing varied devices undergoes many etching and cleaning processes in semiconductor manufacturing processes such as a SEG process, the damages to the hybrid hard mask is greatly reduced due to the different etching selectivity ratios between the middle hard mask and the spacer hard mask. Since the etching selectivity of the spacer hard mask is substantially smaller than that of the middle hard mask, damages to the corner of the hybrid hard mask is effectively resisted, thus the element such as a gate structure covered by the hybrid hard mask is well protected from the exposure. Consequently the undesired materials will not grow on the element. As exemplarily described in the first and second preferred embodiments of the present invention, the epitaxial silicon will not grow on the corners of the gate structure in the SEG process and thus gate performance is protected from influences such as decrease in gate activation or increase in the gate inversion. Furthermore, since the principle part of the hybrid hard mask is the middle hard mask, it makes the hybrid hard mask able to be removed easily and without damaging other elements in following removal process.

In summary, according to the methods of manufacturing a MOS transistor utilizing a hybrid hard mask provided by the present invention, the spacer hard mask of the hybrid hard mask effectively resists consumption in each etching and cleaning process while the middle hard mask, which is the principle part of the hybrid hard mask, makes the hybrid hard mask able to be removed easily, therefore the device covered by the hybrid hard mask is well protected and the yield is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing MOS transistors utilizing a hybrid hard mask, comprising steps of:
   providing a substrate having a dielectric layer and a polysilicon layer formed thereon;
   forming at least a hybrid hard mask having a middle hard mask and a spacer hard mask covering the middle hard mask on the polysilicon layer;
   performing a first etching process to etch polysilicon layer and the dielectric layer with the hybrid hard mask being an etching mask to form a gate structure;
   performing a second etching process to form recesses in the substrate respectively at two sides of the gate structure; and
   performing a selective epitaxial growth (SEG) process to form epitaxial silicon layers in each recess.

2. The method of claim 1, wherein the hybrid hard mask is used to define a position and a length of the gate structure.

3. The method of claim 1, wherein the middle hard mask comprises silicon oxide (SiO), silicon nitride (SiN), silicon oxynitride (SiON), silicon carbon nitride (SiCN), silicon carbide (SiC), silicon oxycarbide (SiOC), silicon-rich-nitride (SRN), high temperature oxide (HTO), bottom anti-reflecting coating (BARC) layer, or Bis(tert-butylamino)silane (BTBAS).

4. The method of claim 1, wherein the spacer hard mask comprises SiN, SiON, SiCN, SiC, SiOC, or silicon-rich-nitride (SRN).

5. The method of claim 1, wherein the middle hard mask and the spacer hard mask have different etching selectivity ratios.

6. The method of claim 1, wherein a width of the middle hard mask and a width of the spacer hard mask has a ratio of 1:10.

7. The method of claim 1 further comprising a step of forming a spacer on sidewalls of the gate structure before performing the second etching process.

8. The method of claim 1, wherein the step of forming the hybrid hard mask further comprises:
   sequentially forming a first hard mask layer and a photoresist on the polysilicon layer;
   performing a lithography process to pattern the photoresist;
   performing an etching process to remove portions of the first hard mask with patterned photoresist functioning as an mask and form the middle hard mask;
   forming a second hard mask layer on the middle hard mask and the polysilicon layer; and
   performing an etching back process to remove portions of the second hard mask layer and to form the spacer hard mask covering the middle hard mask.

9. The method of claim 8 further comprising a step of performing a trimming process after the lithography process to trim the patterned photoresist.

10. The method of claim 8, further comprising a step of performing a trimming process after the etching process to trim the middle hard mask.

11. The method of claim 1 wherein the gate structure is a gate structure of a P-type MOS (PMOS) transistor.

12. The method of claim 11, wherein the epitaxial silicon layer comprises silicon germanium (SiGe).

13. The method of claim 1 wherein the gate structure is a gate structure of an n-type MOS (NMOS) transistor.

14. The method of claim 13, wherein the epitaxial silicon layer comprises silicon carbide (SiC).

15. A method for manufacturing MOS transistors utilizing a hybrid hard mask, comprising steps of:
   providing a substrate having a dielectric layer and a polysilicon layer formed thereon;
   sequentially forming a first hard mask layer and a second hard mask layer on the polysilicon layer;
   performing a lithography and etching process to remove portions of the first hard mask layer and the second hard mask layer to form a middle hard mask;
   forming a third hard mask layer covering the polysilicon layer and the middle hard mask;
   performing an etching back process to remove portions of the third hard mask layer from at least a spacer hard mask covering sidewalls of the middle hard mask and form a hybrid hard mask;
   performing a first etching process to etch polysilicon layer and the dielectric layer with the hybrid hard mask being an etching mask to form a gate structure;
   performing a second etching process to form recesses in the substrate respectively at two sides of the gate structure; and
   performing a selective epitaxial growth (SEG) process to form epitaxial silicon layers in each recess.

16. The method of claim 15, wherein the hybrid hard mask is used to define a position and a length of the gate structure.

17. The method of claim 15, wherein the first hard mask layer comprises SiO, SiN, SiON, SiCN, SiC, SiOC, silicon-rich-nitride (SRN), high temperature oxide (HTO), bottom anti-reflecting coating (BARC) layer, or Bis(tert-butylamino)silane (BTBAS).

18. The method of claim 15, wherein the second hard mask layer comprises SiO, SiN, SiON, SiCN, SiC, SiOC, silicon-rich-nitride (SRN), high temperature oxide (HTO), bottom anti-reflecting coating (BARC) layer, or Bis(tert-butylamino)silane (BTBAS).

19. The method of claim 15, wherein the third hard mask layer comprises SiN, SiON, SiCN, SiC, SiOC, or silicon-rich-nitride (SRN).

20. The method of claim 15, wherein the first hard mask layer, the second hard mask layer, and the third hard mask layer have different etching selectivity ratios.

21. The method of claim 15, wherein a width of the middle hard mask and a width of the spacer hard mask has a ratio of 1:10.

22. The method of claim 15 further comprising a step of forming a spacer on sidewalls of the gate structure before performing the second etching process.

23. The method of claim 15, wherein the lithography and etching process further comprises
   forming a photoresist on the second hard mask layer;
   performing a lithography process to pattern the photoresist; and
   performing an etching process to remove portions of the first hard mask layer and the second hard mask layer with the patterned photoresist functioning as an etching mask and form the middle hard mask.

24. The method of claim 23 further comprising a step of performing a trimming process after the lithography process to trim the patterned photoresist.

25. The method of claim 23, further comprising a step of performing a trimming process after the etching process to trim the middle hard mask.

26. The method of claim 15 wherein the gate structure is a gate structure of a P-type MOS (PMOS) transistor.

27. The method of claim 26, wherein the epitaxial silicon layer comprises silicon germanium (SiGe).

28. The method of claim 15 wherein the gate structure is a gate structure of an n-type MOS (NMOS) transistor.

29. The method of claim 28, wherein the epitaxial silicon layer comprises silicon carbide (SiC).

* * * * *